(12) United States Patent
Kanev et al.

(10) Patent No.: US 11,262,401 B2
(45) Date of Patent: Mar. 1, 2022

(54) WAFER PROBE STATION

(71) Applicant: MPI Corporation, Hsinchu County (TW)

(72) Inventors: Stojan Kanev, Hsinchu County (TW); Chia-Hung Hung, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 12 days.

(21) Appl. No.: 16/854,926

(22) Filed: Apr. 22, 2020

(65) Prior Publication Data

US 2021/0333322 A1 Oct. 28, 2021

(51) Int. Cl.
*G01R 31/28* (2006.01)

(52) U.S. Cl.
CPC ..... *G01R 31/2891* (2013.01); *G01R 31/2887* (2013.01)

(58) Field of Classification Search
CPC ............ G01R 31/2891; G01R 31/2887; G01R 31/2875
See application file for complete search history.

(56) References Cited

U.S. PATENT DOCUMENTS

| | | | | |
|---|---|---|---|---|
| 5,642,056 A * | 6/1997 | Nakajima | .......... | G01R 31/2887 324/750.22 |
| 6,140,828 A * | 10/2000 | Iino | .......... | G01R 31/2887 324/750.22 |
| 11,054,465 B2 * | 7/2021 | Lou | .......... | G01R 1/07342 |
| 2002/0008534 A1 * | 1/2002 | Yamazaki | .......... | G01R 31/2863 324/750.03 |
| 2002/0011835 A1 * | 1/2002 | Yamazaki | .......... | G01R 31/2875 324/750.03 |
| 2004/0100297 A1 * | 5/2004 | Tanioka | .......... | G01R 31/2887 324/750.1 |
| 2005/0083073 A1 * | 4/2005 | Nihei | .......... | G01R 31/2891 324/750.19 |
| 2005/0275418 A1 * | 12/2005 | Chong | .......... | G01R 31/2889 324/750.25 |

(Continued)

FOREIGN PATENT DOCUMENTS

| | | |
|---|---|---|
| TW | 247967 B | 5/1995 |
| TW | 200725794 A | 7/2007 |
| TW | 201245739 A | 11/2012 |

*Primary Examiner* — Patrick Assouad
*Assistant Examiner* — Demetrius R Pretlow
(74) *Attorney, Agent, or Firm* — CKC & Partners Co., LLC

(57) ABSTRACT

A wafer probe station includes a thermal chuck, a chuck stage, a platen, some probes, a first focusing device, a second focusing device and a thermal plate. The thermal chuck heats up to an operational temperature and holds a device under test (DUT). The chuck stage connects with the thermal chuck and moves the thermal chuck. The thermal chuck locates between the chuck stage and the platen. The probes are disposed on the platen and configured to contact with the DUT. The first focusing device is disposed on the platen to focus on the DUT. The second focusing device is disposed on the chuck stage to focus on the probes. The thermal plate locates between the second focusing device and the platen and is configured to heat up to the operational temperature. The thermal plate has a through hole aligning with the second focusing device.

11 Claims, 2 Drawing Sheets

(56) References Cited

U.S. PATENT DOCUMENTS

| | | | | |
|---|---|---|---|---|
| 2007/0096763 | A1* | 5/2007 | Ehrmann | B23K 26/042 |
| | | | | 324/750.23 |
| 2007/0132468 | A1* | 6/2007 | Nakayama | G01R 31/2891 |
| | | | | 324/750.22 |
| 2007/0159532 | A1* | 7/2007 | Kiyokawa | H04N 17/002 |
| | | | | 348/187 |
| 2007/0164770 | A1* | 7/2007 | Easier, Jr. | G01R 31/2891 |
| | | | | 324/750.22 |
| 2007/0206967 | A1* | 9/2007 | Kikuchi | H04N 17/002 |
| | | | | 399/58 |
| 2007/0262782 | A1* | 11/2007 | Hartmann | G01R 31/2891 |
| | | | | 324/750.22 |
| 2007/0268033 | A1* | 11/2007 | Fujita | G01R 31/2891 |
| | | | | 324/750.03 |
| 2008/0191720 | A1* | 8/2008 | Mochizuki | G01R 1/07342 |
| | | | | 324/754.07 |
| 2009/0002011 | A1* | 1/2009 | Tanaka | G01R 31/2891 |
| | | | | 324/762.02 |
| 2009/0058442 | A1* | 3/2009 | Giessmann | G11C 29/56 |
| | | | | 324/754.29 |
| 2009/0315581 | A1* | 12/2009 | Rumiantsev | G01R 31/2886 |
| | | | | 324/750.02 |
| 2011/0037492 | A1* | 2/2011 | Seubert | G01R 1/0491 |
| | | | | 324/756.03 |
| 2013/0082727 | A1* | 4/2013 | Matsumura | G01R 31/2893 |
| | | | | 324/750.16 |
| 2013/0249579 | A1* | 9/2013 | Lin | G01R 1/0408 |
| | | | | 324/750.13 |
| 2013/0278279 | A1* | 10/2013 | Ishii | G01R 1/07342 |
| | | | | 324/750.03 |
| 2017/0092553 | A1* | 3/2017 | Okada | H01L 21/326 |
| 2017/0322236 | A1* | 11/2017 | Ozawa | G01R 31/2889 |
| 2019/0025342 | A1* | 1/2019 | Mori | G01R 1/06794 |
| 2020/0025823 | A1* | 1/2020 | Teich | H01L 21/67248 |
| 2020/0166562 | A1* | 5/2020 | Ishida | G01R 31/2601 |
| 2020/0174060 | A1* | 6/2020 | Mochizuki | G06K 9/00 |
| 2020/0379012 | A1* | 12/2020 | Yamasaki | G01R 31/2891 |
| 2021/0063465 | A1* | 3/2021 | Mochizuki | G01R 31/2601 |
| 2021/0116496 | A1* | 4/2021 | Lou | G01R 1/07342 |
| 2021/0156890 | A1* | 5/2021 | Kobayashi | G01R 31/2865 |
| 2021/0190860 | A1* | 6/2021 | Sameshima | G01R 31/31905 |

* cited by examiner

WAFER PROBE STATION

BACKGROUND

Technical Field

The present disclosure relates to wafer probe stations.

Description of Related Art

As the demand for electronic devices has been increasing nowadays, the quality of the components of the electronic devices correspondingly becomes an important issue of the semiconductor industry. Apart from the improving technology of manufacture for the components, the accuracy of testing for the components has also become more important.

For example, wafer probe stations are in general used to test the quality of the wafers or dies in the semiconductor industry. Hence, the operational accuracy of wafer probe stations is undoubtedly concerned.

SUMMARY

A technical aspect of the present disclosure is to provide a wafer probe station, which can accurately and easily obtain the actual change of the operation distance between the probes and the device under test in a vertical direction after a temperature change of the thermal chuck to the operational temperature.

According to an embodiment of the present disclosure, a wafer probe station includes a thermal chuck, a chuck stage, a platen, a plurality of probes, a first focusing device, a second focusing device and a thermal plate. The thermal chuck is configured to heat up to an operational temperature. The thermal chuck is also configured to hold a device under test. The chuck stage is connected with the thermal chuck. The chuck stage is configured to move the thermal chuck. The thermal chuck is located between the chuck stage and the platen. The probes are disposed on the platen. The probes are configured to contact with the device under test. The first focusing device is disposed on the platen. The first focusing device is configured to focus on the device under test. The second focusing device is disposed on the chuck stage. The second focusing device is configured to focus on at least one of the probes. The thermal plate is located between the second focusing device and the platen. The thermal plate is configured to heat up to the operational temperature. The thermal plate has a through hole. The through hole aligns with the second focusing device.

In one or more embodiments of the present disclosure, the first focusing device includes a mirror and an optical element. The optical element is movable relative to the mirror along an extension direction of the platen. The mirror is configured to reflect an image from the device under test to the optical element. The optical element is configured to focus the image.

In one or more embodiments of the present disclosure, the mirror inclines by 45 degrees relative to the extension direction.

In one or more embodiments of the present disclosure, the second focusing device is configured to focus on a tip of at least one of the probes.

In one or more embodiments of the present disclosure, the thermal plate is connected with thermal chuck.

In one or more embodiments of the present disclosure, the thermal plate is connected with a heat controlling source.

In one or more embodiments of the present disclosure, the thermal plate is a metal.

In one or more embodiments of the present disclosure, the thermal plate is a glass.

In one or more embodiments of the present disclosure, the chuck stage is configured to move the thermal chuck three-dimensionally and rotatably.

In one or more embodiments of the present disclosure, the wafer probe station further includes a light source. The light source is disposed at a side of the second focusing device near to the platen.

In one or more embodiments of the present disclosure, the light source is of an annular shape.

When compared with the prior art, the above-mentioned embodiments of the present disclosure have at least the following advantages:

(1) Through the procedure of focus of the first focusing device and the second focusing device respectively, the actual change of the operation distance between the probes and the device under test at the operational temperature can be accurately and easily obtained. Therefore, even though the wafer probe station experiences thermal expansions at the operational temperature, the tips of the probes can be operated to properly contact with the device under test for testing.

(2) A plurality of subsidiary light sources distributed annularly in the light source provides an even distribution of light coaxially on the tip of at least one of the probes, which is essential for an accurate probe tip placement.

(3) In order to maintain the scenario that the probes are affected by the operational temperature of the thermal chuck, the thermal plate located between the second focusing device and the platen is changed to the operational temperature as well. As a result, the focus of the image of the tip of at least one of the probes is carried out under the simulation of the thermal chuck, at the operational temperature, being located underneath the probes. Therefore, an accurate separation between the second focusing device and the tip of at least one of the probes can be recovered again.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
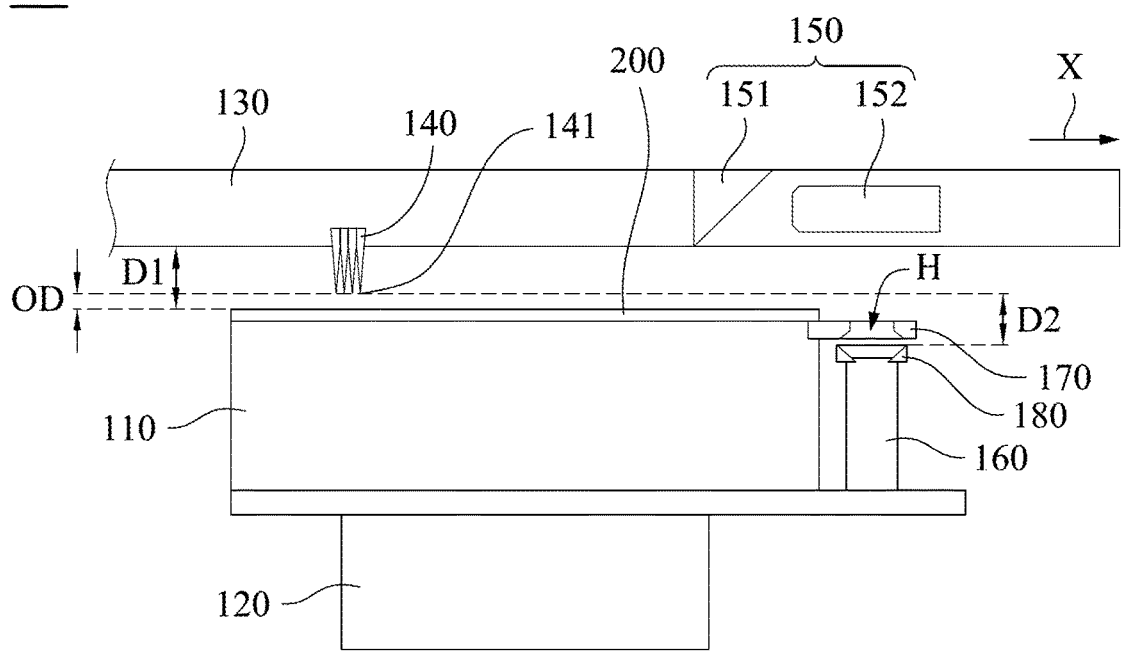
FIG. 1 is a schematic view of a wafer probe station according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic view of a wafer probe station 100 according to an embodiment of the present disclosure. In this embodiment, as shown in FIG. 1, a wafer probe station 100 includes a thermal chuck 110, a chuck stage 120, a platen 130, a plurality of probes 140, a first focusing device 150, a second focusing device 160 and a thermal plate 170. The thermal chuck 110 is configured to hold a device under test (DUT) 200. For example, the device under test 200 can be a wafer. However, this does not intend to limit the present disclosure. The chuck stage 120 is connected with the thermal chuck 110. The chuck stage 120 is configured to move the thermal chuck 110. The thermal chuck 110 is located between the chuck stage 120 and the platen 130. The probes 140 are disposed on the platen 130. The probes 140 are configured to contact with the device under test 200 for subsequent testing. Moreover, the first focusing device 150 is disposed on the platen 130. The first focusing device 150 is configured to focus on the device under test 200. On the other hand, the second focusing device 160 is disposed on the chuck stage 120. The second focusing device 160 is configured to focus on at least one of the probes 140 disposed on the platen 130. The thermal plate 170 is located between the second focusing device 160 and the platen 130. The thermal plate 170 has a through hole H. The through hole H of the thermal plate 170 aligns with the second focusing device 160.

In practical applications, the thermal plate 170 can be made of metal or glass. However, this does not intend to limit the present disclosure. In other embodiments, the thermal plate 170 can be some other materials which have proper heat conductivity.

Before the operation of the wafer probe station 100, the operation distance OD between the probes 140 and the device under test 200 is first determined. The operation distance OD is defined that after the device under test 200 is moved towards the platen 130 by the operation distance OD, the probes 140 are in proper contact with the device under test 200 and relevant testing can be carried out. With regard to the particular operation distance OD, a first distance D1 between the first focusing device 150 and the device under test 200 and a second distance D2 between at least one of the probes 140 and the second focusing device 160 are both determined.

For example, the first distance D1 between the first focusing device 150 and the device under test 200 is determined to be d1 before the operation of the wafer probe station 100. Then, the first focusing device 150 is adjusted to obtain a clear focus of the device under test 200 when the platen 130 and the device under test 200 are separated from each other by d1. In other words, the clear image obtained by the first focusing device 150 represents that the platen 130 and the device under test 200 are separated from each other by d1.

Similarly, for example, the second distance D2 between at least one of the probes 140 and the second focusing device 160 is determined to be d2 before the operation of the wafer probe station 100. Then, the second focusing device 160 is adjusted to obtain a clear focus of at least one of the probes 140 when the probes 140 and the second focusing device 160 are separated from each other by d2. In other words, the clear image obtained by the second focusing device 160 represents that the probes 140 and the second focusing device 160 are separated from each other by d2.

Under the conditions that the platen 130 and the device under test 200 are separated from each other by d1 while the probes 140 and the second focusing device 160 are separated from each other by d2, the probes 140 and the device under test 200 are separated from each other by the particular operation distance OD. Meanwhile, the thermal chuck 110 can be moved towards the platen 130 by the particular distance OD such that the probes 140 can be in proper contact with the device under test 200 for testing.

During the operation of the wafer probe station 100, a temperature of the thermal chuck 110 is changed to an operational temperature T. In practice, there is no limitation for the range of the operational temperature T in the present disclosure. For example, the operational temperature T can be as low as less than 65 degrees, or as high as more than 400 degrees. However, it should be noted that these examples of the operational temperature T as cited herein are only illustrative and are not to limit the claimed scope. A person having ordinary skill in the art of the present disclosure may appropriately choose the range of the operational temperature T according to the actual needs.

After the temperature of the thermal chuck 110 is changed to the operational temperature T, a temperature of the device under test 200 held by the thermal chuck 110 is changed as well. Moreover, the temperature of the surrounding of the thermal chuck 110 is also changed due to the change in temperature of the thermal chuck 110 to the operational temperature T. Thus, the temperature of the platen 130 in the vicinity of the thermal chuck 110 is changed as well. Due to the respective change in temperatures, the thermal chuck 110, the device under test 200 and the platen 130 expand or contract thermally.

With regard to the thermal expansions or the thermal contractions of the thermal chuck 110, the device under test 200 and the platen 130, the first distance D1 between the first focusing device 150 and the device under test 200 may vary and change to d1' from d1 correspondingly. When the platen 130 and the device under test 200 are separated by d1' subsequently, the image previously obtained by the first focusing device 150 will be out of focus and will not be clear anymore.

As shown in FIG. 1, the first focusing device 150 includes a mirror 151 and an optical element 152. The optical element 152 is movable relative to the mirror 151 along an extension direction X of the platen 130. The mirror 151 of the first focusing device 150 is configured to reflect the image of the device under test 200 to the optical element 152 of the first focusing device 150. The optical element 152 of the first focusing device 150 is configured to focus the image of the device under test 200. In practice, with regards to the probes 140 of different lengths according the configuration of a probe card (not shown) which holds the probes 140, the optical element 152 is moved relative to the mirror 151 along the extension direction X of the platen 130 such that the image of the device under test 200 can be clearly focused by the optical element 152.

When the platen 130 and the device under test 200 are separated by d1' such that the image of the device under test 200 previously obtained by the first focusing device 150 is out of focus and becomes unclear, the optical element 152 is moved relative to the mirror 151 in order to obtain a clear image of the device under test 200 again. It is worth to note that the distance D3 that the optical element 152 moves in order to obtain a clear image of the device under test 200 again is equal to the difference between the values of d1 and d1'. The moving distance D3 of the optical element 152 to obtain the clear image of the device under test 200 again is then recorded.

In practice, the mirror 151 of the first focusing device 150 is inclined by 45 degrees relative to the moving direction of the optical element152 of the first focusing device 150, which is the same as the extension direction X of the platen 130. In this way, the image of the portion of the device under test 200 located perpendicularly to the platen 130 can be obtained by the optical element 152. In other words, the portion of the device under test 200 located vertically beneath the mirror 151 is obtained by the platen optical element 152.

On the other hand, when the temperatures of the platen 130 and the surrounding of the thermal chuck 110 are both changed, the temperature of the probes 140 will be changed as well. As a result, the probes 140 expand or contract thermally due to the changes in temperatures. Thus, the second distance D2 between at least one of the probes 140 and the second focusing device 160 may vary and change to d2' from d2 correspondingly.

In practice, in order not to interfere with the location of the device under test 200 to be held on the thermal chuck 110, the second focusing device 160 is disposed on the chuck stage 120 and away from a side of the thermal chuck 110 which at least partially extends perpendicularly away from the platen 130. In other words, the second focusing device 160 is not disposed between the thermal chuck 110 and the platen 130.

Figure 2:
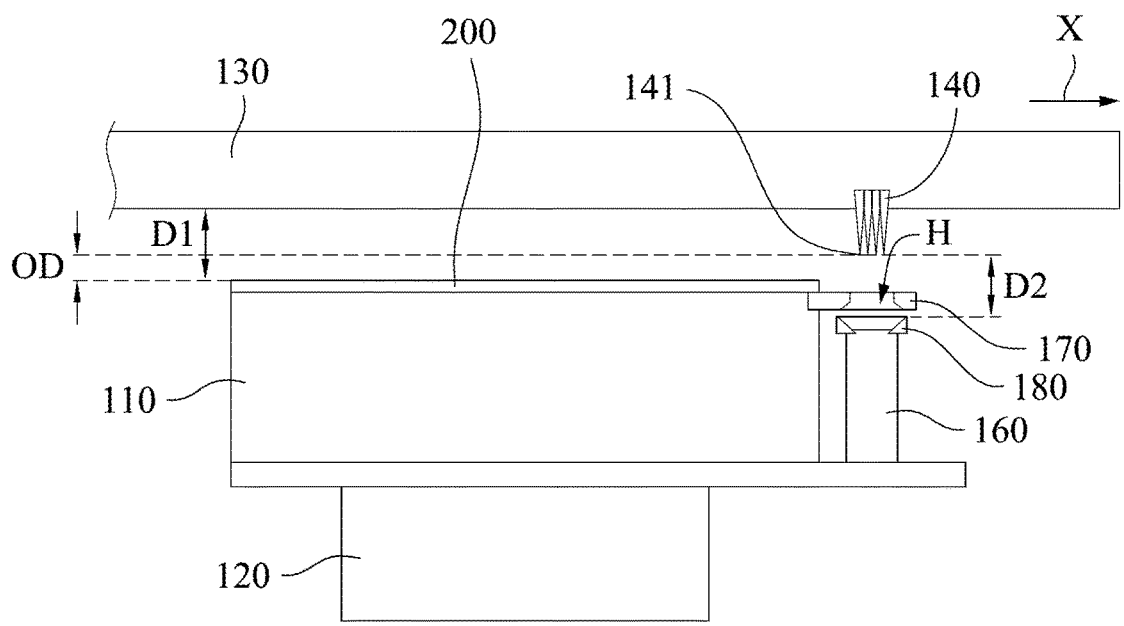
FIG. 2 is a schematic view of the wafer probe station of FIG. 1, in which the second focusing device aligns with the probes.

Reference is made to FIG. 2. FIG. 2 is a schematic view of the wafer probe station 100 of FIG. 1, in which the second focusing device 160 aligns with the probes 140. For the sake of simplified presentation, the first focusing device 150 is not shown in FIG. 2. In practical applications, the chuck stage 120 is configured to move the thermal chuck 110 three-dimensionally and rotatably. For the second focusing device 160 to focus on the probes 140, the thermal chuck 110 together with the second focusing device 160 is moved by the chuck stage 120, horizontally for example, such that the second focusing device 160 aligns with the probes 140, as shown in FIG. 2. As mentioned above, when the probes 140 and the device under test 200 are separated by d2' subsequently, the image of the at least one of the probes 140 previously obtained by the second focusing device 160 will be out of focus and will not be clear anymore. In this embodiment, to be specific, the second focusing device 160 is configured to focus on a tip 141 of at least one of the probes 140.

When the second distance D2 between the probes 140 and the second focusing device 160 changes to d2' such that the image of the tip 141 of at least one of the probes 140 previously obtained by the second focusing device 160 is out of focus and becomes unclear, the chuck stage 120 moves the thermal chuck 110 together with the second focusing device 160, vertically for example, to obtain a clear image of the tip 141 of at least one of the probes 140 again. It is worth to note that the distance D4 that the chuck stage 120 moves towards or away from the platen 130 for the second focusing device 160 to obtain a clear image of the probes 140 again is equal to the difference between the values of d2 and d2'. The moving distance D4 of the chuck stage 120 to obtain the clear image of the tip 141 of at least one of the probes 140 again is then recorded.

Based on the distances D3 and D4 recorded, a change of the operation distance OD between the probes 140 and the device under test 200 can be calculated. Afterwards, the thermal chuck 110 can be moved towards the platen 130 according to the changed operation distance OD such that the probes 140 can be in proper contact with the device under test 200 for testing. In sum, through the procedure of focus of the first focusing device 150 and the second focusing device 160 respectively, the actual change of the operation distance OD between the probes 140 and the device under test 200 at the operational temperature T can be accurately and easily obtained. Therefore, even though the wafer probe station 100 experiences thermal expansions or thermal contractions at the operational temperature T, the tips 141 of the probes 140 can be operated to properly contact with the device under test 200 for testing.

In practice, when the second focusing device 160 aligns with the probes 140, the thermal chuck 110 is shifted away from the probes 140. In order to maintain the scenario that the probes 140 are affected by the operational temperature T of the thermal chuck 110, the thermal plate 170 located between the second focusing device 160 and the platen 130 is changed to the operational temperature T as well. As a result, the focus of the image of the tip 141 of at least one of the probes 140 is carried out under the simulation of the thermal chuck 110, at the operational temperature T, being located underneath the probes 140. Therefore, an accurate separation by d2 between the second focusing device 160 and the tip 141 of at least one of the probes 140 can be recovered again.

Furthermore, in this embodiment, the thermal plate 170 is connected with the thermal chuck 110. In this way, the thermal plate 170 is directly changed to the operational temperature T by the thermal chuck 110 which is changed to the operational temperature T.

In addition, the wafer probe station 100 further includes a light source 180. The light source 180 is disposed at a side of the second focusing device 160 near to the platen 130. The light source 180 is configured to emit a light to the tip 141 of at least one of the probes 140. Thus, the user can focus the image of the tip 141 of at least one of the probes 140 by the second focusing device 160 more easily. For an even distribution of light projected on the probes 140, in this embodiment, the light source 180 is of an annular shape, and the image to be captured by the second focusing device 160 is carried out through the annular light source 180. In other words, a plurality of subsidiary light sources (not shown) distributed annularly in the light source 180 provides an even distribution of light coaxially on the tip 141 of at least one of the probes 140, which is essential for an accurate probe tip placement.

Figure 3:
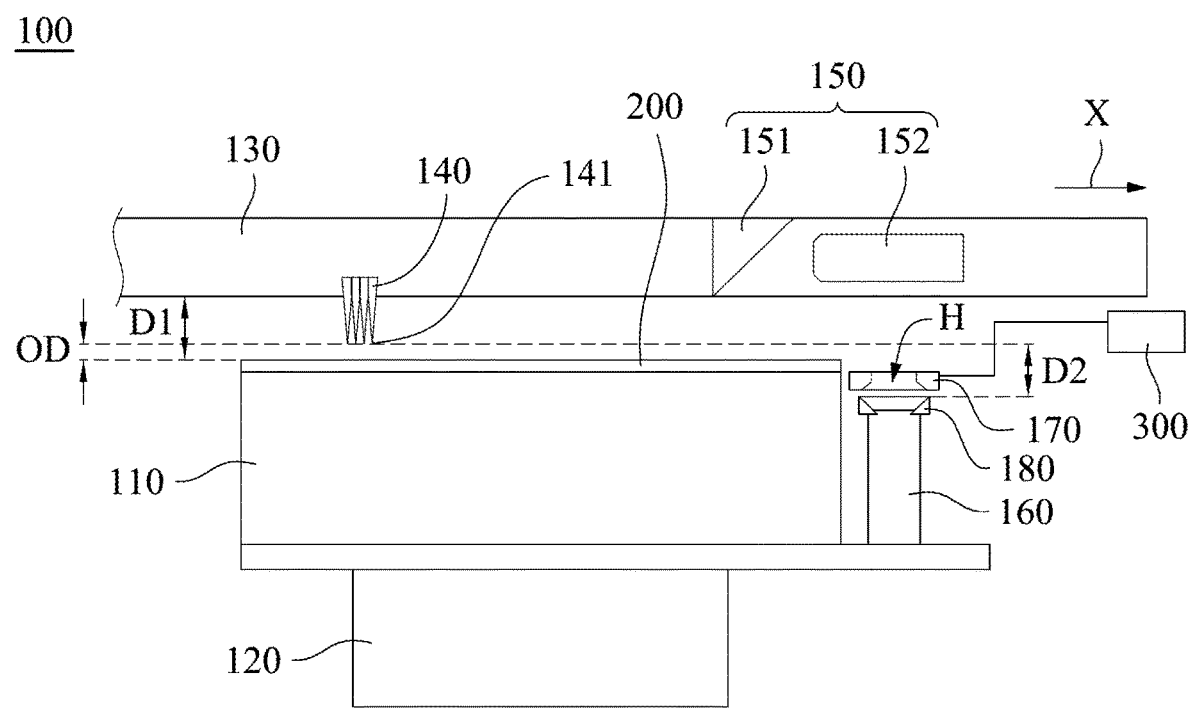
FIG. 3 is a schematic view of a wafer probe station according to another embodiment of the present disclosure.

Reference is made to FIG. 3. FIG. 3 is a schematic view of a wafer probe station 100 according to another embodiment of the present disclosure. In this embodiment, as shown in FIG. 3, the thermal plate 170 is separated from the thermal chuck 110 and is connected with a heat controlling source 300. Thus, the thermal plate 170 is changed to the operational temperature T by the heat controlling source 300 but not by the thermal chuck 110. This provides a flexible arrangement of the wafer probe station 100 for the sake of convenience for the user.

In conclusion, when compared with the prior art, the aforementioned embodiments of the present disclosure have at least the following advantages:

(1) Through the procedure of focus of the first focusing device and the second focusing device respectively, the actual change of the operation distance between the probes and the device under test at the operational temperature can be accurately and easily obtained. Therefore, even though the wafer probe station experiences thermal expansions at the operational temperature, the tips of the probes can be operated to properly contact with the device under test for testing.

(2) A plurality of subsidiary light sources distributed annularly in the light source provides an even distribution of light coaxially on the tip of at least one of the probes, which is essential for an accurate probe tip placement.

(3) In order to maintain the scenario that the probes are affected by the operational temperature of the thermal chuck, the thermal plate located between the second focusing device and the platen is changed to the operational temperature as well. As a result, the focus of the image of the tip of at least one of the probes is carried out under the simulation of the thermal chuck, at the operational temperature, being located underneath the probes. Therefore, an accurate separation between the second focusing device and the tip of at least one of the probes can be recovered again.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A wafer probe station, comprising:
    a thermal chuck configured to heat up to an operational temperature and to hold a device under test;
    a chuck stage connected with the thermal chuck and configured to move the thermal chuck;
    a platen, the thermal chuck being located between the chuck stage and the platen;
    a plurality of probes disposed on the platen and configured to contact with the device under test;
    a first focusing device disposed on the platen and configured to focus on the device under test;
    a second focusing device disposed on the chuck stage and configured to focus on at least one of the probes; and
    a thermal plate located between the second focusing device and the platen and configured to heat up to the operational temperature, the thermal plate having a through hole aligning with the second focusing device.

2. The wafer probe station of claim 1, wherein the first focusing device comprises a mirror and an optical element, the optical element is movable relative to the mirror along an extension direction of the platen, the mirror is configured to reflect an image of the device under test to the optical element, the optical element is configured to focus the image.

3. The wafer probe station of claim 2, wherein the mirror inclines by 45 degrees relative to the extension direction.

4. The wafer probe station of claim 1, wherein the second focusing device is configured to focus on a tip of at least one of the probes.

5. The wafer probe station of claim 1, wherein the thermal plate is connected with thermal chuck.

6. The wafer probe station of claim 1, wherein the thermal plate is connected with a heat controlling source.

7. The wafer probe station of claim 1, wherein the thermal plate is a metal.

8. The wafer probe station of claim 1, wherein the thermal plate is a glass.

9. The wafer probe station of claim 1, wherein the chuck stage is configured to move the thermal chuck three-dimensionally and rotatably.

10. The wafer probe station of claim 1, further comprising a light source connected with the second focusing device and located between the second focusing device and the platen.

11. The wafer probe station of claim 10, wherein the light source is of an annular shape.

* * * * *